United States Patent
Anderson et al.

(10) Patent No.: US 6,933,064 B2
(45) Date of Patent: *Aug. 23, 2005

(54) MULTILAYER WITH SPACERS, TOUCH SCREEN AND METHOD

(75) Inventors: Charles C. Anderson, Penfield, NY (US); Ronald S. Cok, Rochester, NY (US); Rodney D. Feldman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 161 days.

This patent is subject to a terminal disclaimer.

(21) Appl. No.: 10/077,393

(22) Filed: Feb. 15, 2002

(65) Prior Publication Data

US 2003/0170456 A1 Sep. 11, 2003

(51) Int. Cl.[7] .............................. B32B 7/02; G09G 5/00
(52) U.S. Cl. .................. 428/690; 428/212; 428/402; 428/403; 428/917; 345/173
(58) Field of Search ................... 428/690, 917, 428/212, 402, 403; 252/500; 313/504; 315/506; 430/41; 257/40

(56) References Cited

U.S. PATENT DOCUMENTS

| | | | |
|---|---|---|---|
| 5,354,613 A | 10/1994 | Quintens et al. | 428/341 |
| 5,665,498 A | 9/1997 | Savage et al. | 430/41 |
| 5,674,654 A * | 10/1997 | Zumbulyadis et al. | 430/41 |
| 5,738,934 A * | 4/1998 | Jones | 428/220 |
| 5,897,727 A * | 4/1999 | Staral et al. | 156/99 |
| 5,984,468 A * | 11/1999 | Malhotra | 347/102 |
| 6,087,012 A * | 7/2000 | Varaprasad et al. | 428/428 |
| 6,140,030 A * | 10/2000 | Anderson et al. | 430/529 |
| 6,287,713 B1 * | 9/2001 | Heuer et al. | 428/690 |
| 6,392,250 B1 * | 5/2002 | Aziz et al. | 257/40 |
| 6,403,238 B1 * | 6/2002 | Horhold et al. | 428/690 |
| 6,451,505 B1 * | 9/2002 | Patel et al. | 430/273.1 |
| 6,469,267 B1 * | 10/2002 | Welsh et al. | 200/512 |
| 6,473,072 B1 * | 10/2002 | Comiskey et al. | 345/173 |
| 6,665,107 B2 * | 12/2003 | Forgette et al. | 359/267 |
| 2003/0170492 A1 * | 9/2003 | Anderson et al. | 428/690 |

FOREIGN PATENT DOCUMENTS

| | | |
|---|---|---|
| EP | 1 079 397 | 2/2001 |
| EP | 1 172 831 A2 | 1/2002 |

* cited by examiner

*Primary Examiner*—Rena Dye
*Assistant Examiner*—Camie S. Thompson
(74) *Attorney, Agent, or Firm*—Arthur E. Kluegel (57) ABSTRACT

A transparent multilayer comprises a deformable first conductive layer containing an intrinsically conductive polymer, a film forming binder, and spacer elements embedded in and projecting from the surface of the first conductive layer, and a second conductive layer separated from the first conductive layer by the spacer elements. The multilayer is useful as a component in a touch screen display.

41 Claims, 1 Drawing Sheet

MULTILAYER WITH SPACERS, TOUCH SCREEN AND METHOD

FIELD OF THE INVENTION

This invention relates to a multilayer containing intrinsically conductive polymers and embedded spacers useful in touch screens.

BACKGROUND OF THE INVENTION

Touch screens are widely used in conventional CRTs and in flat-panel display devices in computers and in particular with portable computers.

Figure 1:
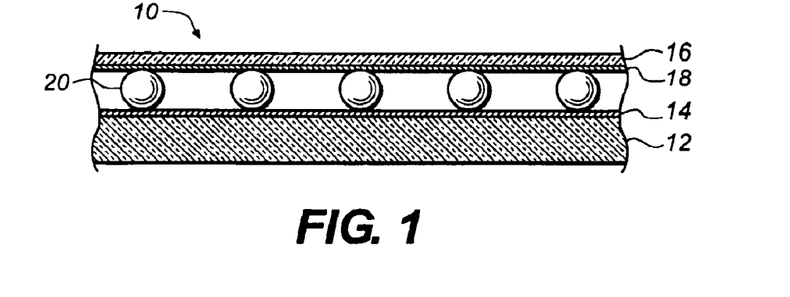
FIG. 1 is a schematic diagram showing a section of a touch screen multilayer of the prior art.

FIG. 1 shows a multilayer 10 for a typical prior art resistive-type touch screen including a transparent substrate 12, having a first conductive layer 14. A flexible transparent cover sheet 16 includes a second conductive layer 18 that is physically separated from the first conductive layer 14 by spacer elements 20. A voltage is developed across the conductive layers. The conductive layers 14 and 18 have a resistance selected to optimize power usage and position sensing accuracy. Deformation of the flexible cover sheet 16 by an external object such as a finger or stylus causes the second conductive layer 18 to make electrical contact with first conductive layer 14, thereby transferring a voltage between the conductive layers. The magnitude of this voltage is measured through connectors (not shown) connected to metal conductive patterns (not shown) formed on the edges of conductive layers 18 and 14 to locate the position of the deforming object.

It is known from U.S. Pat. No. 5,354,613 to employ antistatic coatings containing conductive polythiophene polymeric materials on resin or paper and that such materials may contain matting agents for anti-blocking purposes. It is also known from EP 1,079,397 to use conductive polythiophene polymeric materials to provide an electroconductive pattern on a support and that such materials may contain spacers, UV filters or IR absorbers. It is further known from U.S. Pat. Nos. 5,674,654 and 5,665,498 to use conductive polypyrrole polymeric materials that may contain matting agents as combination antistat/protective layers for imaging elements.

The conventional construction of a resistive touch screen involves the sequential placement of materials upon the substrate. The substrate 12 and cover sheet 16 are first cleaned, then uniform conductive layers are applied to the substrate and cover sheet. It is known to use a coatable intrinsically conductive polymer such as polythiophene or polyaniline to provide the flexible conductive layers. See for example WO 00/39835, which shows a light transmissive substrate having a light transmissive conductive polymer coating, and U.S. Pat. No. 5,738,934 which shows a cover sheet having a conductive polymer coating. The spacer elements 20 are then applied and, finally, the flexible cover sheet 16 is attached.

The deposition of spacer elements between the substrate and flexible cover sheet can be accomplished in several ways, for example by spraying through a mask or pneumatically sputtering small diameter transparent glass or polymer particles, as described in U.S. Pat. No. 5,062,198. The transparent glass or polymer particles are typically 45 microns in diameter or less and mixed with a transparent polymer adhesive in a volatile solvent before application. This process is relatively complex and expensive and the use of an additional material such as an adhesive can be expected to diminish image quality.

Some displays, such as those composed of organic light emitting diodes (OLEDs) are sensitive to ultra-violet light. Other displays may require selective filtration of incident or emitted light in order to provide improved imaging quality. In general, any light with a wavelength less than 400 nm is capable of degrading the organic light emitting diode materials, reducing the lifetime of the display. To reduce the effects of this problem, oxygen may be excluded from OLED devices to the extent possible. UV filters may also reduce the radiation incident on the organic materials in OLED displays and hence the incidence of photo-oxidation. However, the addition of an additional UV filtering layer is undesirable because the addition of another layer tends to degrade image quality and increase costs and manufacturing steps.

Materials used to construct both displays and touch screens may filter light passing through them so that a perceptible color is imparted to the light. For example, when a flat-panel display is viewed through a touch screen, the colors of the flat-panel display may be altered so that the colors are less accurate or the color gamut is reduced. It is generally preferable, if the materials are not perfectly transparent, that they combine to provide a neutral density. Alternatively, under known, relatively invariant light conditions, it may be preferable to induce a particular overall color to light emitted by a display with the use of suitable filters.

It is a problem to be solved to provide an improved touch screen and method of making the same that reduces the difficulty of placing spacer elements while maintaining or improving image quality.

SUMMARY OF THE INVENTION

The invention provides a transparent multilayer comprising a first conductive layer containing an intrinsically conductive polymer, a film forming binder, and spacer elements embedded in and projecting from the surface of the first conductive layer, and a second conductive layer separated from the first conductive layer by the spacer elements. The invention also provides a display incorporating the multilayer and a method of making the multilayer.

The invention provides an improved touch screen and method of making the same that reduces the difficulty of placing spacer elements without sacrificing image quality.

DETAILED DESCRIPTION OF THE INVENTION

Figure 2:
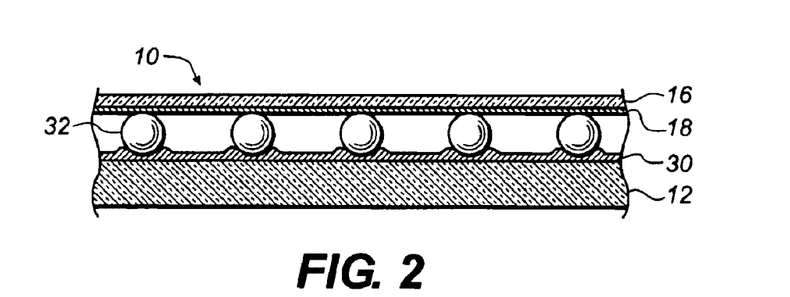
FIG. 2 is a schematic diagram showing a section of a multilayer of the invention.

Referring to FIG. 2, in one embodiment, a multilayer for a resistive touch screen 10 for a resistive touch screen of the type including a transparent substrate 12 bearing a first conductive layer 30, a flexible transparent cover sheet 16 having a second conductive layer 18 and spacer elements 32 located between the substrate 12 and the cover sheet 16.

As used herein, the term "intrinsically conducting polymer" is defined as in U.S. Pat. No. 5,738,934. The term "not water-wettable" means that the surface is not readily wetted by an aqueous medium. The term "microsphere" means particles or beads that are substantially spherical in shape. The term "transparent" includes partial transparency.

This method of the invention is constructed by providing a liquid coating medium containing a conductive polymer, a film forming binder; and spacer elements and coating the liquid coating medium on the substrate 14 or the cover sheet 16. The film forming binder may also include radiation filtering addenda such as UV, neutral density and color adjustment or notch filters. Thus, the multilayer of the invention not only provides the necessary conductive network, but also provides a medium to anchor the spacers and a medium to provide any desired type of actinic radiation filtration of light passing through the screen.

Depending on the coating used and effects desired, different combinations of these addenda may be employed. The conductive polymers and film forming binders with addenda can be coated onto supports in a variety of ways, including spin coating, web coating, and spray coating. The conductive polymers and film forming binders are coated out of an aqueous or organic solvent solution, for environmental reasons it is preferable to employ aqueous solutions. Suitable coatings of conductive polymers such as polythiophene are about 0.5 to 5 microns thick when dried. Microspheres, meaning substantially spherical beads, are suitable spacer elements for providing separation between the conductive layers. For the purposes herein, the microspheres have a diameter of greater than 10 micrometers and typically at least 20 micrometers. Microspheres used for traditional Matte applications are typically less than 10 micrometers in diameter and often 1–2 micrometer in size. Further, layers for matte purposes are often soluble during a subsequent processing step. The microspheres used in the present invention are desirably non-wettable in order to reduce the extent of shorting across the microspheres.

The conductive polymers can be chosen from any or a combination of known intrinsically conductive polymers, as described in U.S. Pat. No. 5,738,934, such as substituted or unsubstituted pyrrole-containing polymers (as mentioned for example, in U.S. Pat. Nos. 5,665,498 and 5,674,654), substituted or unsubstituted thiophene-containing polymers (as mentioned for example, in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408), and substituted or unsubstituted aniline-containing polymers (as mentioned for example, in U.S. Pat. Nos. 5,716,550, 5,093,439, and 4,070,189).

The intrinsically conductive polymer (ICP) provides the necessary electrical conductivity, while the non-conductive binder provides the desirable mechanical properties. Such blends are available from Al-Coat, of Ness-Ziona, Israel, in the form of apolyaniline-based spin-coatable solution. Disclosures of other suitable blends include Heeger et al., U.S. Pat. No. 5,246,627 (1993); Cao et al., U.S. Pat. No. 5,232,631 (1993); the Regents of University of California, published international application WO 91/11325 (1991); Andreatta et al., "Processing Of Conductive Polyaniline-UTMW Polyethylene Blends From Solutions In Non-Polar Solvents," Synth. Met. 55, pp. 1017–22 (1993); Laakso et al., "Synthesis And Characterization Of Conducting Polymer Blends Of Poly(3-Alkylthiophenes)," Synth. Met. 37, pp. 145–50 (1990);and "Neste Conducting Polymers" (brochure), by Neste—Uniax New Technology Development (undated). ICP's are organic polymers which have an extensive, highly conjugated .pi.-electron network in the backbone and which may be doped to impart or enhance the conductive properties. See, for example, MacDiarmid et al., Front. Polym. Res. [Proc. Int. Conf ], 1st, pp. 259–70 (1991) (Plenum, N.Y.).

Exemplary suitable ICP's include polypyrrole, polythiophene, polyacetylene, poly(phenylene vinylene), poly(phenylene sulfide), poly(p-phenylene), polyaniline, and poly(heterocycle vinylene). A reference herein to an ICP is understood to subsume the substituted variants thereof. For example "polypyrrole" subsumes poly(alkoxy pyrrole) and poly(alkyl pyrrole). The non-conductive polymer's primary purpose is to provide a matrix for imparting the desired mechanical properties of the conductive polymeric material, as ICP's themselves often are fragile and/or intractable materials. Suitable non-conductive polymers include polyolefins (e.g., polyethylene and polypropylene), polystyrene, poly(vinyl chloride), acrylonitrile-butadiene-styrene copolymer (ABS), aliphatic polyamide(e.g., nylon), aromatic polyamide (e.g., poly(p-phenyleneterephthalamide)), acrylic polymers, methacrylate polymers (e.g., poly(methyl methacrylate)), polycarbonate, polysiloxane, polybutadiene, ethylene-vinyl acetate copolymer, elastomers (e.g. EPDM rubber), and fluoropolymers (e.g., polytetrafluoroethylene). A wide range in the ratio of ICP to non-conductive polymer is permissible, depending on the desired balance of electrical and mechanical properties. Preferably, the weight ratio of ICP to non-conductive polymer is between 1 to 99 and 99 to 1, with a ratio between 9 to 1 and 1 to 9 being typical.

The conductive layer of the invention should contain about 10 to about 1000 mg/m² dry coating weight of the conductive polymer. Preferably, the conductive layer should contain about 20 to about 500 mg/m² dry coating weight of the conductive polymer. The actual dry coating weight of the conductive polymer applied is determined by the properties for the particular conductive polymer employed and by the requirements for the particular application, the requirements may include, for example, the conductivity, transparency, optical density, cost, etc for the layer.

In one embodiment, the layer containing the conductive polymer is prepared by applying a mixture containing:

(a) a polythiophene with formula I

I wherein each of $R^1$ and $R^2$ independently represents hydrogen or a C1–4 alkyl group or together represent an optionally substituted C1–4 alkylene group or a cycloalkylene group, preferably an ethylene group, an optionally alkyl-substituted methylene group, an optionally C1–12 alkyl- or phenyl-substituted 1,2-ethylene group, a 1,3-propylene group or a 1,2-cyclohexylene group, and (b) a polyanion compound Polyanions used with these conductive polymers include the anions of polymeric carboxylic acids such as polyacrylic acids, poly(methacrylic acid), and poly(maleic acid), and polymeric sulfonic acids such as polystyrenesulfonic acids and polyvinylsulfonic acids, the polymeric sulfonic acids being preferred for use in this invention. These polycarboxylic and polysulfonic acids may also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they may be produced using known methods. Instead of the free acids required for the formation of the electrically conducting polymers and polyanions, mixtures of alkali salts of polyacids and appropriate amounts of monoacids may also be used.

In one desirable embodiment, the polythiophene and polyanion are applied in the presence of a conductivity enhancing agent as described in U.S. Pat. Nos. 5,766,515, 6,083,635, 6,197,418, and European Patent Application EP 1 003 179 A. Such conductivity enhancing compounds include organic compounds containing dihydroxy or polyhydroxy and/or carboxyl groups or amide groups or lactam groups. Suitable organic compounds containing dihydroxy or polyhydroxy and/or carboxyl groups or amide groups correspond to formula (II)

$$(OH)_n-R-(COX)_m \qquad (II)$$

wherein n and m are independent of one another and denote an integer from 1 to 20, preferably from 2 to 8 and R denotes a linear, branched or cyclic alkylene radical having 2 to 20 C atoms or an optionally substituted arylene radical having 6 to 14 C atoms or a heterocyclic radical having 4 to 10 C atoms or a sugar radical or sugar alcohol radical and x denotes —OH or —NYZ, wherein Y, Z independently of one another represent hydrogen or alkyl, preferably hydrogen or $C_1$ to $C_{12}$-alkyl. Examples of suitable organic compounds containing lactam groups are N-methylpyrrolidone, pyrrolidone, caprolactam, N-methylcaprolactam, N-octylpyrrolidone.

Particularly preferred conductivity enhancers are: sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol.

A film-forming binder is employed to improve the physical properties of the conductive layer. The layer may contain from about 5% to 95% of the film-forming binder. The optimum weight percent of the film-forming binder varies depending on the electrical properties of the conductive polymer, the chemical composition of the binder, and the requirements for the particular touch-screen application.

Film-forming binders useful in the conductive layer of this invention can include, but are not limited to, water-soluble or water-dispersible hydrophilic polymers such as gelatin, gelatin derivatives, maleic acid or maleic anhydride copolymers, cellulose derivatives (such as carboxymethyl cellulose, hydroxyethyl cellulose, cellulose acetate butyrate, diacetyl cellulose, and triacetyl cellulose), polyvinyl alcohol, and poly-N-vinylpyrrolidone. Other suitable binders include organic solvent soluble or aqueous emulsions of addition-type homopolymers and copolymers prepared from ethylenically unsaturated monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins; and solvent soluble or aqueous dispersions of polyurethanes or polyesterionomers; or a polysiloxane. To obtain superior physical properties for the layer it is desirable to cross-link the film-forming binder by the addition of a cross-linking agent or by radiation curing. Conventional polymeric matte micro-spheres may be prepared from various ethylenically unsaturated monomers such as styrene and its derivatives, acrylates and methacrylates and used as spacer elements. The polymeric beads may be prepared by suspension polymerization techniques that are well known in the art. The composition and preparation of polymeric matte beads suitable for use in the present invention are disclosed in Research Disclosure, September 1996, page 615. These spherical elements are well known in a variety of applications in the current art. Other suitable polymeric microspheres include those prepared from polyethylene or polytetrafluoroethylene. Such polymeric microspheres are commercially available from Daniel Products, for example. When mixed into the materials, the additives are coated at the same time as the material and dispersed uniformly with the material on the substrate. Web coating, spin coating, and electro-coating techniques have been demonstrated to disperse both conductive polymers and additives suitably.

When it is desired to disperse spacer elements with a resistive layer, the separating particles are first dispersed within the coated material and then the material is coated onto either the substrate of the resistive touch screen or the flexible top layer. This process incorporates into a single step the support coating and application of the spacer elements, thereby improving the dispersion of the spacer elements and decreasing the cost of manufacturing. The two components, substrate and flexible multilayer, are then combined as is known in the art.

When used with colorants, the process is as follows. The color attributes of the flat-panel device and the touch screen are first evaluated. A colorant material is selected to provide the preferred color seen by a viewer of the display when viewed through the flat-panel. In particular, the use of a conductive polymeric material within a suitable matrix with the necessary properties may not be completely transparent or neutral in color. The colorant may be chosen to balance the overall color to a neutral gray or to accentuate a particular color as desired for a specific application or to modify the gamut of the display, for example with notch filters. Suitable colorants such as anionic dyes are known in the art and compatible with conductive polymers. Once the colorant is selected, it is added to the liquid coating medium and the medium is coated on the support, either the substrate or the flexible multilayer. The touch screen is then constructed conventionally.

If ultra-violet protection is needed for the flat-panel display, a UV absorber to reduce photochemical reactions may be added to the layer. A wide variety of UV absorbers are available commercially. To avoid color effects it is most preferable to employ an absorber that has little or no absorption above 380 nm. Examples of suitable UV absorbers include substituted 2-hydroxybenzophenones, hydroxybenzotriazoles, and hydrophenyltriazines. A wide variety of UV absorbers are disclosed in Research Disclosure, September 1996, page 611. Ultra-violet protection may be included in addition to, or independently of, any colorants. After addition to the liquid coating medium, the support is coated, either the substrate or the flexible multilayer, and the touch screen constructed conventionally.

In a further embodiment of the present invention, both the substrate and the flexible multilayer are coated with a resistive material including a combination of additives. For example, the material coated on the substrate might include spacer elements while the material coated on the flexible multilayer might include color modification or ultra-violet protection.

The integration of a touch screen and a flat-panel display can be further enhanced by using either the cover or the substrate of the flat-panel device as the substrate of the touch screen. The flat-panel display may emit light through a transparent cover or through a transparent substrate. The flat-panel display is first manufactured conventionally. This is typically done in large sheets with multiple devices on each sheet. If the touch screen substrate is to act as the flat-panel display substrate, the flat-panel device is completed, the exterior side of the substrate is then cleaned and coated as described above and the remainder of the touch screen constructed.

Figure 3:
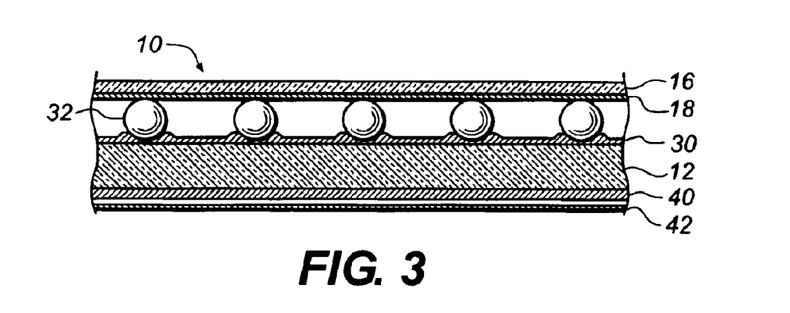
FIG. 3 is a schematic diagram showing a section of an arrangement of a touch screen of the invention on an OLED device.

Referring to FIG. 3, an OLED display including a substrate 12, OLED materials 40 and encapsulator for OLED 42 is provided. The touch screen is formed on the substrate 12 by providing the first conductive layer 30, spacer element 32, second conductive layer 18, and cover sheet 16, as described above. If the touch screen substrate is to act as the flat-panel display cover, the flat-panel display is first constructed but the cover is not affixed. The touch screen is constructed as described above according to an embodiment of the present invention. The touch screen is then affixed as the cover of the flat-panel display to complete the integrated interactive display device.

Figure 4:
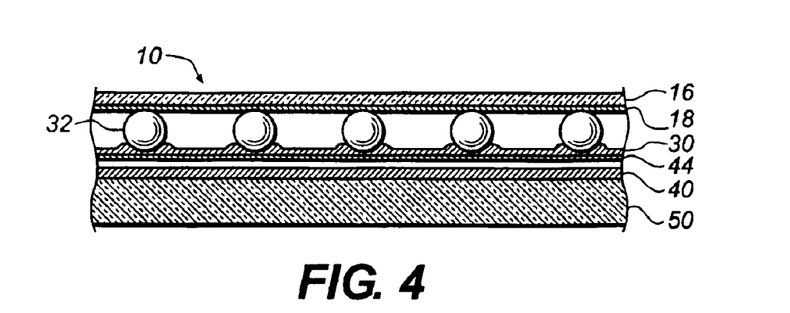
FIG. 4 is a schematic diagram showing a section of a second arrangement of a touch screen of the invention on an OLED device.

Referring to FIG. 4, an OLED device including an OLED substrate 50, OLED materials 40, and transparent cover 44 are provided. The touch screen multilayer is constructed on the transparent OLED cover 44 by providing first conductive layer 30, spacer elements 32, second conductive layer 18, and cover sheet 16, as described above.

The light emitting elements of the addressable pixels of the present invention can be Organic Light Emitting Diodes (OLEDs) including polymeric and small molecule polymeric OLEDs as disclosed in but not limited to U.S. Pat. No. 4,769,292, issued Sep. 6, 1988 to Tang et al.; and U.S. Pat. No. 5,061,569 issued Oct. 29, 1991 to VanSlyke et al. Many combinations and variations of OLED materials would be apparent to those knowledgeable in the art and can be used to fabricate such a device and are included in this invention.

OLED General device architecture

The present invention is conveniently employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, an electroluminescent (EL) element there between containing a light-emitting layer (LEL). A more typical structure contains a substrate, an anode, an optional hole-injecting layer, a hole-transporting layer, a light-emitting layer, an electron-transporting layer, and a cathode. These layers are described in detail below. Note that the substrate may alternatively be located adjacent to the cathode, or the substrate may actually constitute the anode or cathode. Also, the total combined thickness of the organic layers is preferably less than 500 nm.

Substrate

The substrate can either be light transmissive or opaque, depending on the intended direction of light emission. The light transmissive property is desirable for viewing the EL emission through the substrate. Transparent glass or an organic material is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer. For applications where EL emission is viewed through the top electrode, the transmissive characteristics of layer are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer be provided between anode and hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., anaphthalene. When G is an aryl group, it is conveniently a phenylene, biphenylene, or naphthalene group.

A useful class of triarylamine groups satisfying structural formula (A) and containing two triarylamine groups is represented by structural formula (B):

where
  $R_1$ and $R_2$ each independently represents a hydrogen atom, an aryl group, or an alkyl group or $R_1$ and $R_2$ together represent the atoms completing a cycloalkyl group; and
  $R_3$ and $R_4$ each independently represents an aryl group, which is in turn substituted with a diaryl substituted amino group, as indicated by structural formula (C):

wherein $R_5$ and $R_6$ are independently selected aryl groups. In one embodiment, at least one of $R_5$ or $R_6$ contains a polycyclic fused ring group, e.g., a naphthalene.

Another class of aromatic tertiary amine groups are the tetraaryldiamines. Desirable tetraaryldiamines groups include two diarylamino groups, such as indicated by formula (C), linked through an arylene group. Useful tetraaryldiamines include those represented by formula (D).

wherein
  each Are is an independently selected arylene group, such as a phenylene or anthracene group,
  n is an integer of from 1 to 4, and
  Ar, $R_7$, $R_8$, and $R_9$ are independently selected aryl groups. In a typical embodiment, at least one of Ar, $R_7$, $R_8$, and $R_9$ is a polycyclic fused ring group, e.g., a naphthalene The various alkyl, alkylene, aryl, and arylene groups of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis [N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

E wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-$\mu$-oxo-bis(2-methyl-8-quinolinolate) aluminum(III)

CO-5: Indium trisoxine [alias, tris(8-quinolinolato) indium]

CO-6: Aluminum tris(5-methyloxine) [alias, tris(5-methyl-8-quinolinolato) aluminlum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

F wherein: $R^1$, $R^2$, $R^3$, $R^4$, $R^5$, and $R^6$ represent hydrogen or one or more substituents selected from the following groups:

Group 1: hydrogen, alkyl and alkoxy groups typically having from 1 to 24 carbon atoms;

Group 2: a ring group, typically having from 6 to 20 carbon atoms;

Group 3: the atoms necessary to complete a carbocyclic fused ring group such as naphthyl, anthracenyl, pyrenyl, and perylenyl groups, typically having from 6 to 30 carbon atoms;

Group 4: the atoms necessary to complete a heterocyclic fused ring group such as furyl, thienyl, pyridyl, and quinolinyl groups, typically having from 5 to 24 carbon atoms;

Group 5: an alkoxylamino, alkylamino, and arylamino group typically having from 1 to 24 carbon atoms; and Group 6: fluorine, chlorine, bromine and cyano radicals.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful hosts capable of supporting electroluminescence, and are particularly suitable for light emission of wavelengths longer than 400 nm, e.g., blue, green, yellow, orange or red.

G where:

n is an integer of 3 to 8;

Z is —O, —NR or —S where R is H or a substituent; and

R' represents one or more optional substituents where R and each R' are H or alkyl groups such as propyl, t-butyl, and heptyl groups typically having from 1 to 24 carbon atoms; carbocyclic or heterocyclic ring groups such as phenyl and naphthyl, furyl, thienyl, pyridyl, and quinolinyl groups and atoms necessary to complete a fused aromatic ring group typically having from 5 to 20 carbon atoms; and halo such as chloro, and fluoro;

L is a linkage unit usually comprising an alkyl or ary group which conjugately or unconjugately connects the multiple benzazoles together.

An example of a useful benzazole is 2, 2',2"-(1,3,5-phenylene)tris[1-phenyl-1H-benzimidazole].

Desirable fluorescent dopants include groups derived from fused ring, heterocyclic and other compounds such as anthracene, tetracene, xanthene, perylene, rubrene, coumarin, rhodamine, quinacridone, dicyanomethylenepyran, thiopyran, polymethine, pyrilium thiapyrilium, and carbostyryl compounds. Illustrative examples of useful dopants include, but are not limited to, the following:

L1

L2

L3

L4

L5

L6

L7

-continued

L8

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

| | R |
|---|---|
| L37 | phenyl |
| L38 | methyl |
| L39 | t-butyl |
| L40 | mesityl |

| | R |
|---|---|
| L41 | phenyl |
| L42 | methyl |
| L43 | t-butyl |
| L44 | mesityl |

L45

L46

L47

L48

Electron-Transporting Layer (ETL)

Preferred thin film-forming materials for use in forming the electron-transporting layer of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplar of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, layers LEL and ETL can optionally be collapsed into a single layer that serves the function of supporting both light emission and electron transportation.

Cathode

When light emission is through the anode, the cathode layer used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

Unless otherwise specifically stated, use of the term "group", "substituted" or "substituent" means any group or radical other than hydrogen. Additionally, when reference is made in this application to a compound or group that contains a substitutable hydrogen, it is also intended to encompass not only the unsubstituted form, but also its form further substituted with any substituent group or groups as herein mentioned, so long as the substituent does not destroy properties necessary for the intended utility. Suitably, a substituent group may be halogen or may be bonded to the remainder of the molecule by an atom of carbon, silicon, oxygen, nitrogen, phosphorous, or sulfur. The substituent may be, for example, halogen, such as chlorine, bromine or fluorine; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, cyclohexyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy) ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy) butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl) carbonylamino,p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropylsulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl; N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy, sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy) ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen and sulfur, such as 2-furyl, 2-thienyl, 2-benzimidazolyloxy or 2-benzothiazolyl; quaternary ammonium, such as triethylammonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, hydrophobic groups, solubilizing groups, blocking groups, and releasing or releasable groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

The entire contents of the patents and other publications referred to in this specification are incorporated herein by reference.

PARTS LIST 10 transparent multilayer
12 substrate
14 first conductive layer
16 cover sheet
18 second conductive layer
20 spacer element
30 first conductive layer
32 spacer element
40 OLED materials
42 encapsulator for OLED
44 transparent cover for OLED
50 OLED substrate

What is claimed is:

1. A transparent multilayer comprising a deformable first conductive layer containing an intrinsically conductive polymer, a film forming binder, and spacer elements embedded in and projecting from the surface of the first conductive layer, and a second conductive layer separated from the first conductive layer by the spacer elements to prevent contact between the conductive layers in the absence of external deformation.

2. The multilayer of claim 1 wherein the intrinsically conductive polymer comprises at least one member selected from the group consisting of a substituted or unsubstituted polythiophene, polyaniline, polypyrrole, and poly(p-phenylene vinylene) compound.

3. The multilayer of claim 2 wherein the intrinsically conductive polymer is a polythiophene compound.

4. The multilayer or claim 3 wherein the intrinsically conductive polymer is a polyethylenedioxythiophene compound.

5. The multilayer of claim 1 wherein the spacers are microspheres.

6. The multilayer of claim 5 wherein the microspheres are not water-wettable.

7. The multilayer of claim 5 wherein the microspheres comprise a polymeric resin.

8. The multilayer of claim 5 wherein the microspheres comprise polyethylene or polytetrafluoroethylene.

9. The multilayer of claim 7 wherein the polymeric resin contains a cross-linked repeating unit.

10. The multilayer of claim 9 wherein the microspheres comprise a polymeric resin cross-linked with the film forming binder.

11. The multilayer of claim 8 wherein the polymeric resin contains an ethylenic repeating group.

12. The multilayer of claim 8 wherein the polymeric resin contains a repeating unit selected from styrenic and acrylic groups.

13. The multilayer of claim 4 wherein the polyethylenedioxythiophene polymer is represented Formula I wherein $R_1$ and $R_2$ are independently hydrogen or an alkyl, alkylenyl or cycloalkyl group having 1 to 4 carbon atoms, or together form a substituted or unsubstituted group or a substituted or unsubstituted 1,2-cyclohexylene group

I

14. The multilayer of claim 13 additionally comprising a polyanion compound selected from the anions of polymeric polycarboxylic acids and polymeric polysulfonic acids.

15. The multilayer of claim 13 comprising a polyanion compound containing a polyacrylic acid, poly(methacrylic acid), poly(maleic acid), polystyrenesulfonic acid or a polyvinylsulfonic acid.

16. The multilayer of claim 1 additionally comprising a conductivity enhancing compound selected from polyhydroxy, polycarboxy, polyamide and polylactam compounds.

17. The multilayer of claim 16 wherein the conductivity enhancing compound is a sugar, a sugar derivative, a polyalkylene glycol, glycerol, or a compound represented by Formula II

II wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group.

18. The multilayer of claim 16 wherein the conductivity enhancing compound is N-methylpyrrolidone, pyrrolidone, caprolactam, N-methylcaprolactam, N-octylpyrrolidone, sucrose, glucose, fructose, lactose, sugar alcohol, 2-furan carboxylic acid, 3-furan carboxylic acid, sorbitol, glycol, ethylene glycol, glycerol, diethylene glycol, or triethylene glycol.

19. The multilayer of claim 1 wherein the film forming binder comprises gelatins, gelatin derivatives, maleic acid or maleic anhydride copolymers, cellulose derivatives (such as carboxymethyl cellulose, hydroxyethyl cellulose, cellulose acetate butyrate, diacetyl cellulose, and triacetyl cellulose), polyvinyl alcohol, and poly-N-vinylpyrrolidone, acrylates, methacrylates, acrylamides and methacrylamides, itaconic acid and its half-esters and diesters, styrenes, acrylonitrile and methacrylonitrile, vinyl acetates, vinyl ethers, vinyl and vinylidene halides, and olefins; polyurethanes, polyesterionomers; or polysiloxanes.

20. The multilayer of claim 1 additionally comprising a filtering compound capable of absorbing actinic radiation.

21. A touch screen, comprising;
   a) a flexible transparent cover sheet bearing a first conductive layer;
   b) a transparent substrate bearing a second conductive layer and located relative to the transparent substrate so that the first and second conductive layers face each other; and
   c) spacer elements extending between the conductive layers to prevent contact in the absence of external deformation;

wherein at least one of the first or second conductive layers comprises an intrinsically conductive polymer, a film forming binder, and spacer elements embedded in and projecting from the surface of the layer.

22. The screen of claim 21 wherein the spacer elements comprise microspheres.

23. The screen of claim 22 wherein the microspheres are not water-wettable.

24. The screen of claim 21 wherein the layer containing an intrinsically conductive polymer and a film forming binder also contains a filtering compound capable of absorbing actinic radiation.

25. The touch screen of claim 21, wherein the spacer elements are embedded in the conductive layer on the flexible transparent cover sheet.

26. The touch screen of claim 21, wherein the spacer elements are embedded in the conductive layer on the transparent substrate.

27. The touch screen of claim 21, wherein the conductive layer comprising an intrinsically conductive polymer is present on both the transparent substrate and the flexible transparent cover sheet.

28. A display device comprising an OLED and the screen of claim 21.

29. A display device of claim 28 wherein the transparent substrate is also a substrate of the OLED that emits light through the substrate.

30. A display device of claim 28 wherein the transparent substrate is also a cover of the OLED that emits light through the cover.

31. A method of making a touch screen display component of the type including a transparent substrate having a conductive layer, a flexible transparent cover sheet bearing a conductive layer, and spacer elements extending between the substrate and the cover sheet, comprising the steps of:
   a) providing a liquid coating medium containing an intrinsically conductive polymer, a film forming binder and spacer elements;
   b) coating the liquid coating medium on the substrate or the cover sheet and drying to form at least one of the conductive layers,
   c) providing the other conductive layer on the other of the substrate or the cover sheet, and
   d) joining the substrate and cover sheet with their conductive layers facing each other and the spacer elements extending there-between.

32. The method of claim 31, wherein the spacer elements are microspheres that are not water-wettable and comprise a polymer having ethylenic repeating units.

33. The method of claim 31, comprising the additional step of forming the coating on a transparent substrate of an OLED so that the OLED emits light through the substrate.

34. The method of claim 31, comprising the additional step of forming the coating on the transparent cover of an OLED so that the OLED emits light through the cover.

35. The method of claim 31, wherein the spacer elements are coated with the conductive layer comprising an intrinsically conductive polymer on the flexible transparent cover sheet.

36. The method of claim 31, wherein the spacer elements are coated with the conductive layer comprising an intrinsically conductive polymer on the transparent substrate.

37. The method of claim 31, wherein the conductive layer comprising an intrinsically conductive polymer is coated on both the transparent substrate and the flexible transparent cover sheet.

38. The method of claim 31, wherein the coated conductive layer is coated using spin coating.

39. The method of claim 31, wherein the coated conductive layer is coated using web coating.

40. The method of claim 31, wherein the coated conductive layer is coated using spray coating.

41. The method of claim 26, wherein the coated conductive layer is coated using electro-coating.

* * * * *